United States Patent
Takemura (10) Patent No.: US 9,484,886 B2
(45) Date of Patent: Nov. 1, 2016

(54) SURFACE ACOUSTIC WAVE DEVICE AND COMPOSITE MODULE INCLUDING SAME

(71) Applicant: Murata Manufacturing Co., Ltd., Nagaokakyo-shi, Kyoto-fu (JP)

(72) Inventor: Tadaji Takemura, Nagaokakyo (JP)

(73) Assignee: Murata Manufacturing Co., Ltd, Kyoto (JP)

( * ) Notice: Subject to any disclaimer, the term of this patent is extended or adjusted under 35 U.S.C. 154(b) by 171 days.

(21) Appl. No.: 14/325,468

(22) Filed: Jul. 8, 2014

(65) Prior Publication Data

US 2014/0320234 A1    Oct. 30, 2014

Related U.S. Application Data

(63) Continuation of application No. PCT/JP2013/051696, filed on Jan. 28, 2013.

(30) Foreign Application Priority Data

Feb. 3, 2012 (JP) .................. 2012-021790

(51) Int. Cl.
*H03H 9/10* (2006.01)
*H03H 9/64* (2006.01)
*H03H 9/02* (2006.01)

(52) U.S. Cl.
CPC ........... *H03H 9/64* (2013.01); *H03H 9/02622* (2013.01); *H03H 9/1092* (2013.01); *H03H 9/02866* (2013.01); *H03H 9/1071* (2013.01)

(58) Field of Classification Search
CPC ............. H03H 9/02622; H03H 9/02834; H03H 9/02866; H03H 9/02897; H03H 9/0542; H03H 9/058; H03H 9/059; H03H 9/1092; H03H 9/1071; H03H 9/64

USPC .......................................... 333/133, 193–196
See application file for complete search history.

(56) References Cited

U.S. PATENT DOCUMENTS

| | | | | |
|---|---|---|---|---|
| 4,163,201 A | * | 7/1979 | Takahashi | H03H 9/02559 252/62.9 R |
| 4,364,017 A | * | 12/1982 | Tokunaga | H03H 3/08 310/313 R |
| 4,388,600 A | * | 6/1983 | Wakino | H03H 9/02866 310/313 R |

(Continued)

FOREIGN PATENT DOCUMENTS

| | | | |
|---|---|---|---|
| JP | 56-087912 A | * | 7/1981 |
| JP | 63-196106 A | | 8/1988 |

(Continued)

OTHER PUBLICATIONS

Official Communication issued in International Patent Application No. PCT/JP2013/051696, mailed on Apr. 2, 2013.

*Primary Examiner* — Barbara Summons
(74) *Attorney, Agent, or Firm* — Keating & Bennett, LLP (57) ABSTRACT

A surface acoustic wave device includes a piezoelectric substrate including an interdigital transducer located on one principal surface thereof, an insulating layer arranged around the interdigital transducer, a cover layer arranged over the insulating layer and the interdigital transducer, and a columnar electrode penetrating through the insulating layer and the cover layer, and connected to the interdigital transducer through a connection wiring, wherein a buffer layer is arranged on the other principal surface of the piezoelectric substrate.

14 Claims, 4 Drawing Sheets

(56) References Cited

U.S. PATENT DOCUMENTS

| | | | | |
|---|---|---|---|---|
| 5,708,402 | A * | 1/1998 | Hachisu | G06G 7/195 310/313 R |
| 6,018,211 | A * | 1/2000 | Kanaboshi | H03H 9/1092 310/313 R |
| 7,148,769 | B2 * | 12/2006 | Takano | H03H 3/08 29/25.35 |
| 7,609,129 | B2 * | 10/2009 | Yokota | H03H 9/02574 333/133 |
| 2002/0101304 | A1 * | 8/2002 | Onishi | H03H 9/02559 333/193 |
| 2004/0197599 | A1 * | 10/2004 | Higuchi | C30B 19/00 428/689 |
| 2007/0200462 | A1 | 8/2007 | Takano | |
| 2009/0051245 | A1 | 2/2009 | Takayama et al. | |
| 2009/0194325 | A1 | 8/2009 | Takano et al. | |
| 2011/0043078 | A1 | 2/2011 | Tsuda | |

FOREIGN PATENT DOCUMENTS

| | | | |
|---|---|---|---|
| JP | 11-312949 A | | 11/1999 |
| JP | 2001-053579 A | * | 2/2001 |
| JP | 2002-330047 A | * | 11/2002 |
| JP | 2007-243915 A | | 9/2007 |
| JP | 2007-259410 A | | 10/2007 |
| JP | 2007-273585 A | | 10/2007 |
| JP | 2008-227748 A | | 9/2008 |
| JP | 2011-147098 A | | 7/2011 |
| JP | 2012-015767 A | | 1/2012 |
| WO | 2006/106831 A1 | | 10/2006 |

* cited by examiner

SURFACE ACOUSTIC WAVE DEVICE AND COMPOSITE MODULE INCLUDING SAME

BACKGROUND OF THE INVENTION

1. Field of the Invention

The present invention relates to a surface acoustic wave device, such as a surface acoustic wave filter or a surface acoustic wave duplexer (demultiplexer), and a composite module including the surface acoustic wave device.

2. Description of the Related Art

A surface acoustic wave (SAW) filter is a filter utilizing characteristics of a surface acoustic wave (SAW), i.e., a wave propagating along a substance surface. A surface acoustic wave (SAW) duplexer is a duplexer using the surface acoustic wave filter. In surface acoustic wave devices such as the surface acoustic wave filter and the surface acoustic wave duplexer, an IDT (Interdigital Transducer) is formed on a piezoelectric substrate by employing a metallic thin film. In that type of surface acoustic wave device, electrical inputting and outputting are performed by exciting and receiving the surface acoustic wave based on the piezoelectric effect. The surface acoustic wave device functions as a filter through a process of selecting only a frequency component f that satisfies the relationship of $f=v/\lambda$ where v denotes the propagation velocity of an acoustic surface wave depending on a substrate material, and $\lambda$ denotes a period of electrode fingers of the interdigital transducer. In comparison with the propagation velocity of an electromagnetic wave, i.e., about 300,000 km/s, the propagation velocity v of the surface acoustic wave in the surface acoustic wave filter is very slow, i.e., 2000 m/s to 5000 m/s, and the period $\lambda$ of the electrode fingers in the surface acoustic wave filter is small. Therefore, the filter utilizing the surface acoustic wave is suitable for downsizing and is widely used particularly in mobile communication devices, such as a cellular phone, in recent years.

In many of those mobile communication devices, electronic components are used in the form of modules. Japanese Unexamined Patent Application Publication No. 2008-227748 discloses a surface acoustic wave device in which deformation of a hollow structure of the surface acoustic wave filter caused by pressure applied in forming the module is suppressed, and a method of manufacturing the surface acoustic wave device.

Figure 6:
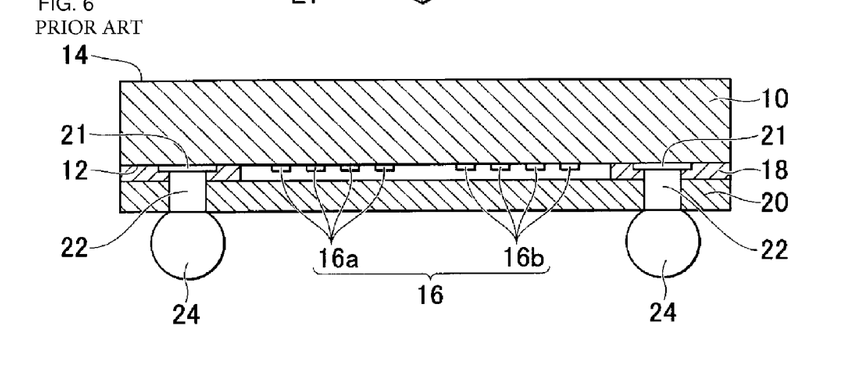
FIG. 6 is a sectional view of a surface acoustic wave device of the related art.

FIG. 6 is a sectional view of a surface acoustic wave device, as an electronic component, disclosed in Japanese Unexamined Patent Application Publication No. 2008-227748. An interdigital transducer 16 is disposed on one principal surface 12 of a piezoelectric substrate 10. An insulating layer 18 is disposed on the one principal surface 12 around the interdigital transducer 16, and a cover layer 20 is arranged over the insulating layer 18 and the interdigital transducer 16 so as to cover them. Thus, to maintain the specific function, the surface acoustic wave device has a hollow structure in which a cavity is formed above the interdigital transducer 16 which is a vibrating portion, and the surroundings of the interdigital transducer 16 are sealed off by the insulating layer 18. Furthermore, the surface acoustic wave device illustrated in FIG. 6 includes a via hole electrode 22 penetrating through both the insulating layer 18 and the cover layer 20 and connected to the interdigital transducer 16 through a connection wiring 21, and a connection electrode 24 arranged at an end portion of the via hole electrode 22 on the side opposite to the piezoelectric substrate 10.

In the case of a surface acoustic wave filter of transversal type, for example, the interdigital transducer 16 is constituted by an input interdigital transducer 16a and an output interdigital transducer 16b. When an electric signal is applied to the input interdigital transducer 16a, a surface acoustic wave corresponding to the period of the electrode fingers is generated based on the piezoelectric effect. The generated surface acoustic wave is propagated to the output interdigital transducer 16b along the surface of the piezoelectric substrate 10. A signal output having a frequency corresponding to the period of the electrode fingers of the output interdigital transducer 16b as description above.

Recently, reductions in size and thickness of a composite module incorporating the above-described surface acoustic wave device have been demanded eagerly, and the necessity of reducing the height of the surface acoustic wave device has been increased correspondingly.

In trying to reduce the thickness of the surface acoustic wave device, it is also required to reduce the thickness of a piezoelectric substrate. However, when the thickness of the piezoelectric substrate 10 is reduced, a bulk wave generated together with a surface acoustic wave causes a problem with filter characteristics. More specifically, when a signal is input to the input interdigital transducer 16a, the bulk wave propagating inside the piezoelectric substrate 10 together with the surface acoustic wave is radiated in the direction of thickness of the piezoelectric substrate 10. The radiated bulk wave is reflected at the other principal surface 14 of the piezoelectric substrate (i.e., a principal surface of the piezoelectric substrate where the interdigital transducer 16 is not formed), and is superimposed on the surface acoustic wave in the principal surface 12 of the piezoelectric substrate on the same side as the interdigital transducer 16. In the case of a thick piezoelectric substrate, although the bulk wave is reflected at the other principal surface 14 of the piezoelectric substrate, the bulk wave is attenuated because a propagation length up to the principal surface 12 is relatively long. In the case of a thin piezoelectric substrate, however, the propagation distance is shortened and an attenuation of the reflected bulk wave inside the piezoelectric substrate is reduced. Hence, an amount of the bulk wave reaching the principal surface 12 is increased and an influence upon the surface acoustic wave is also increased.

SUMMARY OF THE INVENTION

Accordingly, preferred embodiments of the present invention provide a surface acoustic wave device in which deterioration of filter characteristics is significantly reduced or prevented by reducing a bulk wave superimposed on a surface acoustic wave.

According to a preferred embodiment of the present invention, a surface acoustic wave device includes a piezoelectric substrate including an interdigital transducer provided on one principal surface thereof, an insulating layer arranged around the interdigital transducer, a cover layer arranged over the insulating layer and the interdigital transducer to cover them, and a columnar electrode penetrating through the insulating layer and the cover layer, and connected to the interdigital transducer through a connection wiring, wherein a buffer layer is disposed on the other principal surface of the piezoelectric substrate.

According to a preferred embodiment of the present invention, a bulk wave propagating in the direction of thickness of the piezoelectric substrate is absorbed by the buffer layer. Therefore, the bulk wave superimposed on a surface acoustic wave is significantly reduced, and deterioration of filter characteristics is significantly reduced or prevented. Thus, preferred embodiments of the present invention contribute to reduction of the height of the surface acoustic wave device by reducing the thickness of the piezoelectric substrate while quality of the filter characteristics is maintained. Furthermore, since a top surface of the surface acoustic wave device is defined by the buffer layer, laser marking on the surface acoustic wave device can be practiced without damaging the piezoelectric substrate.

In the configuration described above, resin may be used as the buffer layer, and a filler may be contained in the resin to make the acoustic impedance of the buffer layer closer to that of the piezoelectric substrate. With that feature, the acoustic impedance of the buffer layer can be set closer to that of the piezoelectric substrate. As a result, the bulk wave propagating inside the piezoelectric substrate and reaching the buffer layer is reflected to a smaller extent at the interface between the piezoelectric substrate and the buffer layer, and the effect of absorbing the bulk wave is enhanced. Thus, the bulk wave superimposed on the surface acoustic wave is further reduced, and the effect of suppressing the deterioration of the filter characteristics is enhanced. In addition, when the resin used as the buffer layer is of a hardening type, the piezoelectric substrate is prevented from being damaged by, e.g., impacts applied when the surface acoustic wave device is dropped or mounted.

By using, as the above-mentioned filler, a filler having a smaller coefficient of linear expansion than the resin used as the buffer layer, a coefficient of linear expansion of the entire buffer layer is made closer to that of the piezoelectric substrate. Therefore, deformation of the piezoelectric substrate caused by a temperature change due to the difference in coefficient of linear expansion between the piezoelectric substrate and the buffer layer is significantly reduced, and the deterioration of the characteristics of the surface acoustic wave device caused by the temperature change is significantly reduced or prevented.

In the configuration described above, the buffer layer may be constituted by a plurality of layers having different acoustic impedances from each other. With that feature, since the bulk wave passes through a plurality of interfaces and is reflected at those interfaces, and the passed bulk wave is absorbed by the buffer layer. Thus, the bulk wave is absorbed by the plural layers, and the effect of reducing the bulk wave superimposed on the surface acoustic wave is enhanced.

In the configuration described above, the layers having coefficients of linear expansion even closer to a coefficient of linear expansion of the piezoelectric substrate may be positioned successively from side close to the piezoelectric substrate. With that feature, the effect of reducing the bulk wave is enhanced. In addition, since the difference in coefficient of linear expansion is reduced between the piezoelectric substrate and the buffer layer adjacent to the former and between the adjacent buffer layers, stress generated at each interface due to temperature change becomes smaller. As a result, it is possible to is significantly reduce or prevent deformation of the piezoelectric substrate, which is caused by temperature change due to the difference in coefficient of linear expansion, and to significantly reduce or prevent the deterioration of the characteristics of the surface acoustic wave device, which is caused by the temperature change.

In the configuration described above, the buffer layer may be arranged to cover only the interdigital transducer when looking at the piezoelectric substrate in a plan view. With that feature, since the buffer layer is arranged over the least necessary region, the cost of the buffer layer is reduced while the bulk wave superimposed on the surface acoustic wave is reduced.

In the configuration described above, irregularities may be provided in the other principal surface of the piezoelectric substrate on side opposite to the surface thereof where the interdigital transducer is disposed. With that feature, since the bulk wave is absorbed by the buffer layer and is scattered at the irregular surface, the effect of reducing the bulk wave superimposed on the surface acoustic wave is enhanced. Furthermore, the strength of adhesion between the piezoelectric substrate and the buffer layer is increased.

In the configuration described above, irregularities may be provided in a surface of the buffer layer on side opposite to the piezoelectric substrate. With that feature, since the bulk wave is absorbed by the buffer layer and is scattered at the irregular surface, the effect of reducing the bulk wave superimposed on the surface acoustic wave is enhanced.

A composite module may be provided in which the above-mentioned surface acoustic wave device is mounted on a substrate.

With various preferred embodiments of the present invention, the deterioration of the filter characteristics is significantly reduced or prevented by reducing the bulk wave superimposed on the surface acoustic wave. Therefore, the thickness of the piezoelectric substrate is reduced while quality of the filter characteristics is maintained. This leads to a reduction of the height of the surface acoustic wave device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
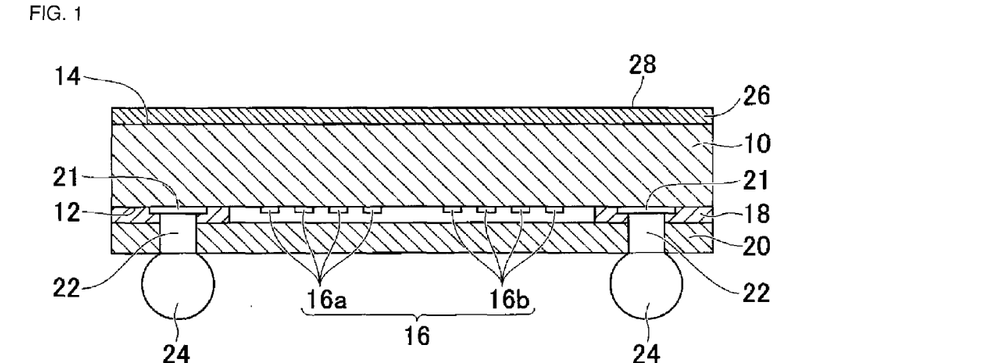
FIG. 1 is a sectional view of a surface acoustic wave device according to a preferred embodiment of the present invention.

One of various preferred embodiments of a surface acoustic wave device according to the present invention will be described below with reference to FIG. 1. The surface acoustic wave device according to the present preferred embodiment of the present invention includes a piezoelectric substrate 10 including one principal surface 12 on which an interdigital transducer 16 is provided. The piezoelectric substrate 10 preferably is made of a piezoelectric single crystal of, e.g., lithium tantalate ($LiTaO_3$), lithium niobate ($LiNbO_3$), or quartz ($SiO_2$). An insulating layer 18 is disposed on the piezoelectric substrate around the interdigital transducer 16, and a cover layer 20 is disposed over the insulating layer 18 and the interdigital transducer 16 so as to cover them. The insulating layer 18 and the cover layer 20 may be each made of resin such as an epoxy resin, a polyimide resin, silicone, a phenol resin, an unsaturated polyester resin, or a polyurethane resin. Thus, to maintain the specific function, the surface acoustic wave device according to a preferred embodiment of the present invention has a hollow structure in which a cavity is provided above the interdigital transducer 16 which is a vibrating portion.

The surface acoustic wave device according to the present preferred embodiment further includes a buffer layer 26 that is located on a principal surface 14 of the piezoelectric substrate 10 on the side opposite to the surface 12 thereof where the interdigital transducer is located. The buffer layer 26 is desirably made of a material which is capable of absorbing a bulk wave propagating through the piezoelectric substrate and reaching the buffer layer 26, which has an acoustic impedance close to that of the piezoelectric substrate, high heat resistance, and a coefficient of linear expansion close to that of the piezoelectric substrate, and which exhibits good adhesion with respect to the piezoelectric substrate and good workability. As with the insulating layer 18 and the cover layer 20, the buffer layer 26 may also be made of resin such as an epoxy resin, a polyimide resin, silicone, a phenol resin, an unsaturated polyester resin, or a polyurethane resin.

The surface acoustic wave device according to the present preferred embodiment still further includes a via hole electrode 22 that is a columnar electrode penetrating through both the insulating layer 18 and the cover layer 20 and connected to the interdigital transducer 16 through a connection wiring 21, and a connection electrode 24 arranged at an end portion of the via hole electrode 22 on the side opposite to the piezoelectric substrate. The connection electrode 24 may be a bump electrode made of Au or a solder, for example.

With the configuration described above, the surface acoustic wave device according to the present preferred embodiment significantly reduces or prevents deterioration of filter characteristics, which is caused by reducing the thickness of the piezoelectric substrate 10.

When a signal is input to an input interdigital transducer 16a, a surface acoustic wave is generated and propagated to an output interdigital transducer 16b. At that time, a bulk wave propagating inside the piezoelectric substrate 10 is generated in the direction of thickness of the piezoelectric substrate in addition to the generation of the surface acoustic wave. The generated bulk wave propagates through the inside of the piezoelectric substrate and reaches the surface 14 of the piezoelectric substrate 10 on the side opposite to the surface 12 thereof where the interdigital transducer 16 is located.

Considering now the case where the principal surface 14 of the piezoelectric substrate on the side opposite to the principal surface 12 thereof where the interdigital transducer 16 is located is contacted with air instead of the buffer layer 26, the bulk wave is substantially totally reflected. The reason is that the difference in the acoustic impedance between air and the piezoelectric substrate 10 is very large. The acoustic impedance is expressed by the product of the acoustic velocity in a medium and the density of the medium. Thus, the acoustic impedance of air with the density of about 1.29 kg/$m^3$ and the acoustic velocity of 331 m/s is about 430 kg/$m^2$s. On the other hand, when the surface acoustic wave filter is designed by using lithium tantalate (density: 7.45×$10^3$ kg/$m^3$) as the piezoelectric substrate 10 and by utilizing a leaky wave with the acoustic velocity of 4000 m/s, the acoustic impedance of the piezoelectric substrate 10 is about 2.98×$10^7$ kg/$m^2$s and is much larger than that of air. Therefore, the bulk wave is substantially totally reflected at the principal surface 14 that is contacted with air.

By disposing the buffer layer 26 on the other principal surface 14 of the piezoelectric substrate on the side opposite to the interdigital transducer 16, however, the difference in acoustic impedance between adjacent regions on both sides of the principal surface 14 as a boundary is reduced to a large extent. Accordingly, the bulk wave partly passes through the interface between the piezoelectric substrate 10 and the buffer layer 26, and is attenuated by the buffer layer 26. As a result, the bulk wave superimposed on the surface acoustic wave is reduced, such that the deterioration of the filter characteristics is significantly reduced or prevented.

As described above, the surface acoustic wave device according to the present preferred embodiment prevents the deterioration of the filter characteristics by reducing the bulk wave superimposed on the surface acoustic wave. Furthermore, as a result of overcoming the problem that the bulk wave is superimposed on the surface acoustic wave, it becomes practically possible to reduce the thickness of the piezoelectric substrate 10 and to reduce the height of the surface acoustic wave device.

In addition, when the buffer layer 26 is made of a hardening resin, breakage (such as fracture, cracking, or chipping) of the piezoelectric substrate 10 which may be caused by, e.g., impacts applied when the surface acoustic wave device is dropped or mounted, is prevented.

Moreover, because laser marking on the piezoelectric substrate may cause cracks, marking the component number, etc. on a top surface of the surface acoustic wave device cannot be practiced when the buffer layer is not present. However, when an epoxy resin or a polyimide resin, for example, is used as the buffer layer 26, the laser marking on a surface of the buffer layer 26, which defines the top surface of the surface acoustic wave device, can be practiced.

In the configuration described above, a filler may be added to the buffer layer 26. For example, when the buffer layer 26 is made of an epoxy resin or a polyimide resin, the filler added to the buffer layer 26 may be, e.g., silica, alumina, carbon, or Ag. When the resin is silicone, the added filler may be, e.g., silica, alumina, carbon, Ag, or quartz.

By adding the filler, it is possible to adjust the density of the buffer layer 26, and to make the acoustic impedance of the buffer layer 26 closer to that of the piezoelectric substrate 10. As a result, the bulk wave reflected and superimposed on the surface acoustic wave is further reduced, and the effect of reducing or preventing the deterioration of the filter characteristics is enhanced. Adding the filler further provides the effect of scattering the bulk wave. Moreover, adding the filler having a smaller coefficient of linear expansion than the resin can make the coefficient of linear expansion of the buffer layer 26 closer to that of the piezoelectric substrate 10. It is hence possible to significantly reduce or prevent deformation of the piezoelectric substrate 10, which is caused by change due to the difference in coefficient of linear expansion between the piezoelectric substrate 10 and the buffer layer 26, and to significantly reduce or prevent deterioration of characteristics of the surface acoustic wave device, which is caused by temperature change.

A heavy metal, such as tungsten (W: density of 19200 kg/m$^3$), tantalum (Ta: density of 16700 kg/m$^3$), or gold (Au: density of 19300 kg/m$^3$), can also be used as the filler.

When the heavy metal is used as the filler, the density of the buffer layer 26 is increased in comparison with the case using, e.g., silica as the filler. Therefore, the acoustic impedance of the buffer layer 26 can be made even closer to that of the piezoelectric substrate 10, and the effect of attenuating the bulk wave at the interface between the piezoelectric substrate 10 and the buffer layer 26 is further increased. In addition, since the bulk wave is scattered by the filler made of the heavy metal, the influence of the reflected bulk wave upon the filter characteristics is significantly reduced or prevented.

Figure 2:
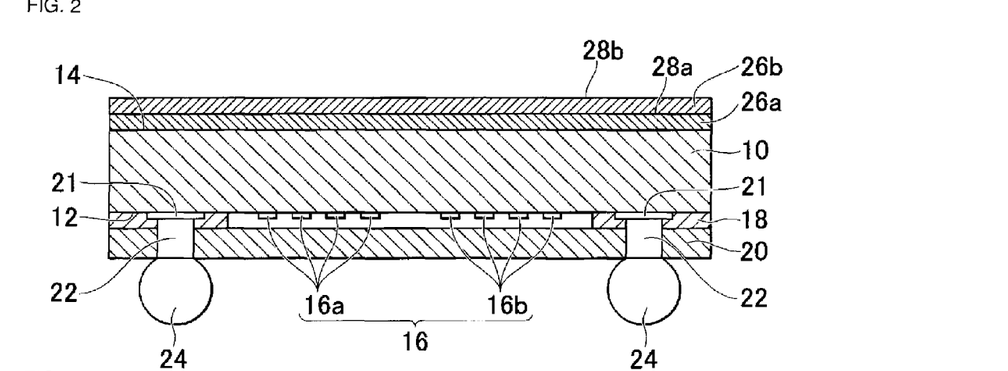
FIG. 2 is a sectional view of a surface acoustic wave device including two buffer layers 26a and 26b having different acoustic impedances from each other.

In the configuration described above, the buffer layer 26 may be constituted by a plurality of layers having different acoustic impedances from each other. FIG. 2 is a sectional view of a surface acoustic wave device including, e.g., two buffer layers 26a and 26b having different acoustic impedances from each other. The first buffer layer 26a preferably is a layer having the acoustic impedance close to that of the piezoelectric substrate 10, and the second buffer layer 26b preferably is a layer having the acoustic impedance close to that of the first buffer layer 26a. The plural layers having different acoustic impedances from each other are formed, for example, using different materials. The plural layers having different acoustic impedances from each other may be each made of resin. The plural layers having different acoustic impedances from each other may be made of the same type of material. The acoustic impedance of the same type of material can be made different depending on, e.g., addition of the filler, the type of the filler added, and an amount of the filler added.

Because the difference in acoustic impedance between the piezoelectric substrate 10 and the first buffer layer 26a is small, an extent of reflection of the bulk wave propagating inside the piezoelectric substrate 10 and reaching the first buffer layer 26a is reduced, and a portion of the bulk wave having passed through the interface between the piezoelectric substrate 10 and the first buffer layer 26a is absorbed by the first buffer layer 26a. Furthermore, because the difference in acoustic impedance between and the first buffer layer 26a and the second buffer layer 26b is also small, the bulk wave having been not absorbed by the first buffer layer 26a is absorbed by the second buffer layer 26b. Thus, since the bulk wave is absorbed twice, the bulk wave reflected toward the interdigital transducer is reduced, and the effect of reducing or preventing the deterioration of the characteristics of the surface acoustic wave device, which is caused by the bulk wave, is further increased.

In the above-described configuration in which the buffer layer 26 preferably includes the plural layers having different acoustic impedances from each other, those plural layers may be configured such that layers having coefficients of linear expansion even closer to that of the piezoelectric substrate 10 are positioned successively from the side close to the piezoelectric substrate 10. Since the difference in coefficient of linear expansion is reduced between the piezoelectric substrate 10 and the buffer layer adjacent to the former and between the adjacent buffer layers, stress generated at each interface due to temperature change becomes smaller. As a result, it is possible to significantly reduce or prevent deformation of the piezoelectric substrate, which is caused by temperature change due to the difference in coefficient of linear expansion, and to significantly reduce or prevent the deterioration of the characteristics of the surface acoustic wave device, which is caused by the temperature change.

Figure 7:
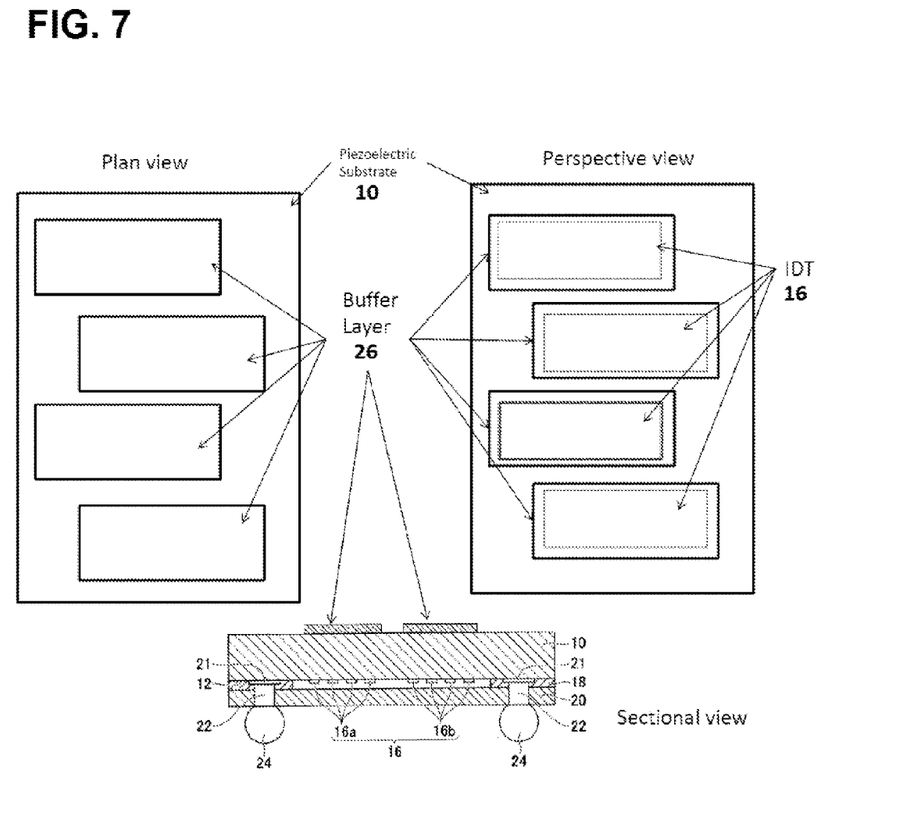
FIG. 7 is a plan view, a perspective view, and a sectional view of a surface acoustic wave device according to a preferred embodiment of the present invention, in which a buffer layer 26 is arranged to cover only the interdigital transducer 16 when looking at the piezoelectric substrate 10 in a plan view.
Figure 8:
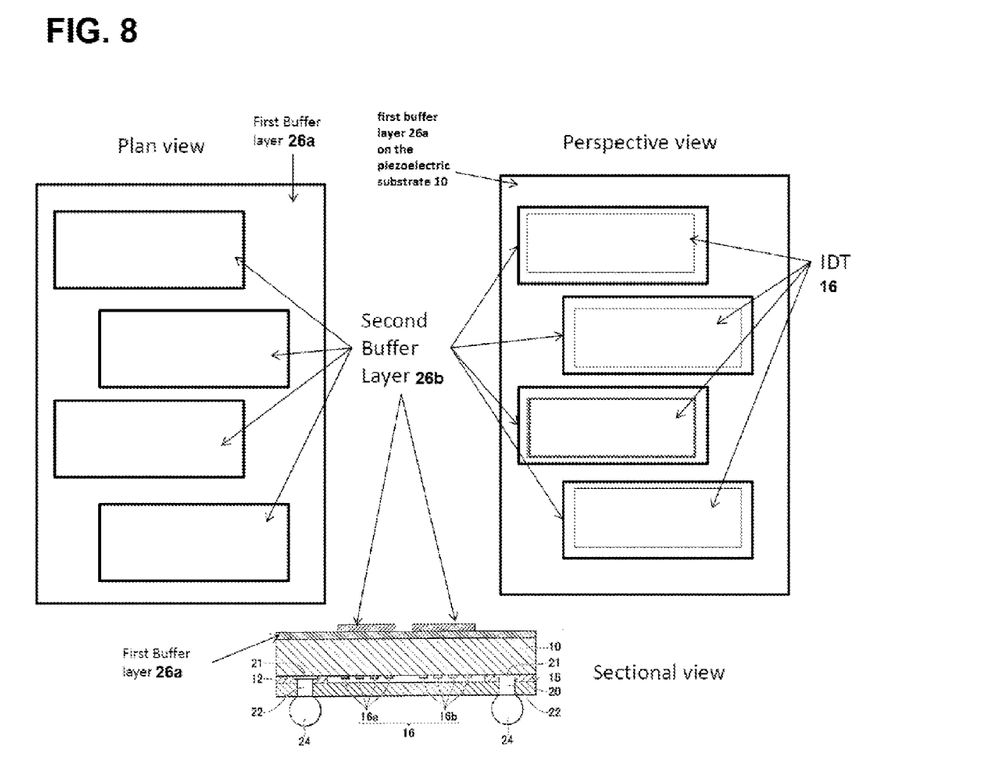
FIG. 8 is a plan view, a perspective view, and a sectional view of a surface acoustic wave device according to a preferred embodiment of the present invention, in which the plurality of layers 26a and 26b having different acoustic impedances from each other have different sizes.

As shown in FIG. 7, the buffer layer 26 may have a size so as to cover only the interdigital transducer 16 when looking at the piezoelectric substrate 10 in a plan view. That configuration reduces the cost required for the buffer layer 26 in comparison with the case of forming the buffer layer 26 over the entire principal surface 14 of the piezoelectric substrate while the effect of reducing the bulk wave superimposed on the surface acoustic wave is ensured. Furthermore, as shown in FIG. 8, the plural layers having different acoustic impedances from each other may have different sizes such that, when looking at the piezoelectric substrate 10 in a plan view, a portion of those plural layers is a buffer layer in size covering only the interdigital transducer 16 instead of the entire piezoelectric substrate, and the remaining layer(s) is a buffer layer in size covering the entire principal surfaces 12 and 14 of the piezoelectric substrate 10.

Figure 3:
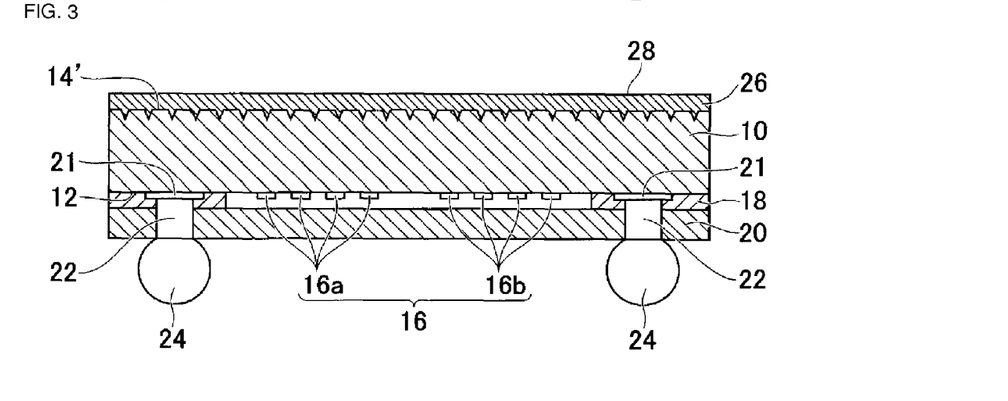
FIG. 3 is a sectional view of a surface acoustic wave device in which irregularities are provided in a principal surface of a piezoelectric substrate 10 on the side opposite to a surface 12 thereof where an interdigital transducer 16 is disposed, and a buffer layer 26 is provided on the irregularities.

FIG. 3 is a sectional view of a surface acoustic wave device in which irregularities are provided in the principal surface 14 of the piezoelectric substrate 10 on the side opposite to the surface 12 thereof where the interdigital transducer 16 is disposed, and the buffer layer is provided on the irregularities. The irregularities in the principal surface of the piezoelectric substrate can be formed, for example, by roughing the surface of the piezoelectric substrate with a file or a sand bluster. The other configuration of the surface acoustic wave device illustrated in FIG. 3 preferably is the same as that of the surface acoustic wave device illustrated in FIG. 1. In the configuration of FIG. 3, however, the buffer layer 26 may be constituted by plural different layers as described above.

With the configuration described above, since the bulk wave reflected at an irregular surface 14' is scattered, the effect of reducing the bulk wave superimposed on the surface acoustic wave is enhanced. Furthermore, strength of adhesion between the piezoelectric substrate 10 and the buffer layer 26 is increased.

Figure 4:
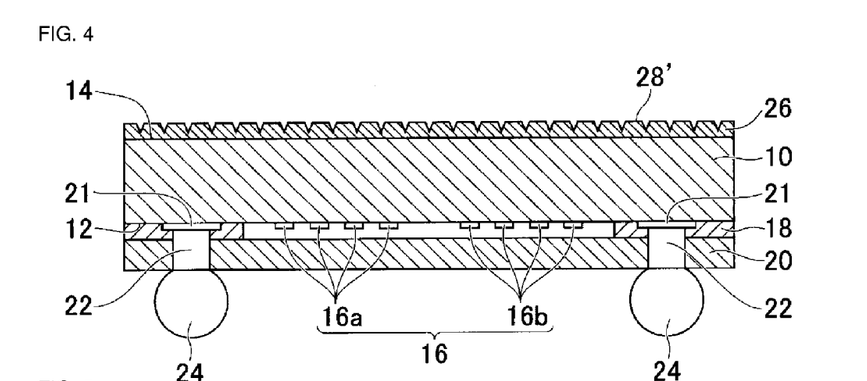
FIG. 4 is a sectional view of a surface acoustic wave device in which irregularities are provided in a surface 28 of the buffer layer on the side opposite to the piezoelectric substrate 10.

FIG. 4 is a sectional view of a surface acoustic wave device in which irregularities are provided in a surface of the buffer layer 26 on the side opposite to the piezoelectric substrate 10. The irregularities in the surface of the buffer layer can be formed, for example, by roughing the surface of the buffer layer with a file or a sand blaster. The other configuration of the surface acoustic wave device illustrated in FIG. 4 is the same as that of the surface acoustic wave device illustrated in FIG. 1. In the configuration of FIG. 4, however, the buffer layer 26 may include plural different layers as described above. In such a case, the irregularities may be provided in each surface of a portion or all of the plural different layers on the side opposite to the piezoelectric substrate 10.

With the configuration described above, since the bulk wave reflected at an irregular surface 28' is scattered, the effect of reducing the bulk wave superimposed on the surface acoustic wave is enhanced.

Figure 5:
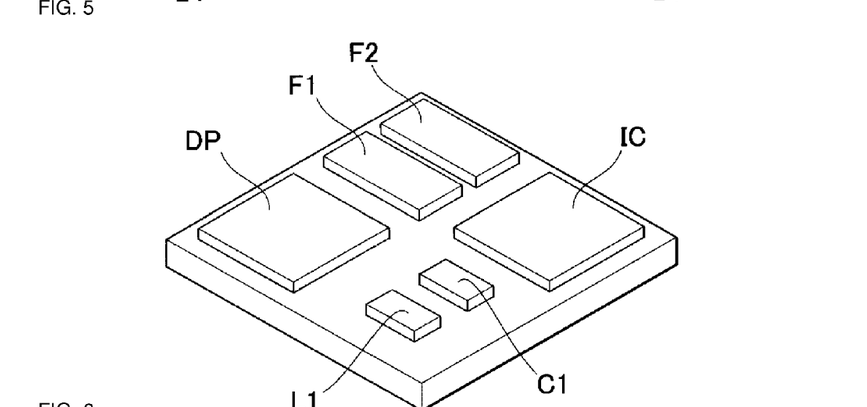
FIG. 5 is a perspective view of a preferred embodiment of a composite module in which the surface acoustic wave device according to the present invention is mounted on a substrate.

FIG. 5 is a perspective view of a preferred embodiment of a composite module according to the present invention. The composite module according to the present preferred embodiment illustrated in FIG. 5, includes one or more above-described surface acoustic wave devices according to other preferred embodiments of the present invention, other electronic components, and a substrate on which the formers are mounted. The composite module may include, as each of surface acoustic wave filters F1 and F2, the surface acoustic wave device according to other preferred embodiments of the present invention. Furthermore, the composite module may include, as a surface acoustic wave duplexer DP, the surface acoustic wave device according to other preferred embodiments of the present invention. The substrate of the composite module may be, for example, a ceramic multilayer substrate or a resin multilayer substrate. The other electronic components than the surface acoustic wave devices mounted on the substrate of the composite module may be, for example, a capacitor C1, an inductance L1, and a switch IC, as illustrated in FIG. 5.

The surface acoustic wave devices incorporated in the composite module are each a device that has overcome, as described above, the problem of deterioration of filter characteristics caused by reduction of the thickness of the surface acoustic wave device. Therefore, the present preferred embodiment is greatly contributable to, e.g., the case where a high-quality filter is needed and reduction of the thickness of the entire module is demanded.

Surface acoustic wave devices according to various preferred embodiments of the present invention are suitably applicable particularly in, e.g., mobile communication devices, such as a cellular phone, in which a smaller and thinner filter with high quality is demanded.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
 a piezoelectric substrate including an interdigital transducer located on one principal surface thereof;
 an insulating layer arranged around the interdigital transducer;
 a cover layer arranged over the insulating layer and the interdigital transducer; and
 a columnar electrode penetrating through the insulating layer and the cover layer, and connected to the interdigital transducer through a connection wiring; wherein
 a buffer layer is disposed on the other principal surface of the piezoelectric substrate;
 the buffer layer includes a plurality of layers having different acoustic impedances from each other; and
 each of the plurality of layers contains irregularities.

2. The surface acoustic wave device according to claim 1, wherein at least one of the plurality of layers of the buffer layer is made of resin, and a filler having a smaller coefficient of linear expansion than the resin is contained in the resin.

3. The surface acoustic wave device according to claim 1, wherein the plurality of layers having different acoustic impedances from each other are configured such that the layers having coefficients of linear expansion successively closer to a coefficient of linear expansion of the piezoelectric substrate are positioned successively closer to the piezoelectric substrate and the layer having the coefficient of linear expansion closest to the coefficient of linear expansion of the piezoelectric substrate is positioned closest to the piezoelectric substrate.

4. The surface acoustic wave device according to claim 1, wherein the buffer layer is arranged to cover only the interdigital transducer when looking at the piezoelectric substrate in a plan view.

5. The surface acoustic wave device according claim 1, wherein irregularities are provided in the other principal surface of the piezoelectric substrate, and the buffer layer is arranged on the other principal surface including the irregularities.

6. The surface acoustic wave device according to claim 5, wherein the irregularities provided in the other principal surface of the piezoelectric substrate are defined by roughened surface portions of the piezoelectric substrate.

7. The surface acoustic wave device according to claim 1, wherein the irregularities in at least one of the plurality of layers of the buffer layer are provided in a surface thereof on a side opposite to the piezoelectric substrate.

8. The surface acoustic wave device according to claim 7, wherein the irregularities are defined by roughened surface portions.

9. The surface acoustic wave device according to claim 1, wherein the plurality of layers having different acoustic impedances from each other have different sizes.

10. A composite module comprising:
 a substrate; and
 the surface acoustic wave device according to claim 1 mounted on the substrate.

11. The composite module according to claim 10, further comprising an additional one of the surface acoustic wave device mounted on the substrate.

12. The composite module according to claim 10, wherein the substrate is one of a ceramic multilayer substrate and a resin multilayer substrate.

13. A mobile communication device comprising the composite module according to claim 10.

14. A mobile communication device comprising the surface acoustic wave device according to claim 1.

* * * * *